(12) United States Patent
Willer et al.

(10) Patent No.: US 7,767,567 B2
(45) Date of Patent: Aug. 3, 2010

(54) METHOD OF FORMING A SEMICONDUCTOR MEMORY DEVICE AND SEMICONDUCTOR MEMORY DEVICE

(75) Inventors: Josef Willer, Riemerling (DE); Franz Hofmann, Munich (DE)

(73) Assignee: Qimonda AG, Munich (DE)

( * ) Notice: Subject to any disclaimer, the term of this patent is extended or adjusted under 35 U.S.C. 154(b) by 82 days.

(21) Appl. No.: 11/541,404

(22) Filed: Sep. 29, 2006

(65) Prior Publication Data

US 2008/0096352 A1    Apr. 24, 2008

(51) Int. Cl.
*H01L 21/3205* (2006.01)
(52) U.S. Cl. .................. 438/587; 438/257; 438/637; 438/586; 438/620; 257/391; 257/E21.179
(58) Field of Classification Search ............ 438/257, 438/637, 586, 620, 587; 257/391, E21.179
See application file for complete search history.

(56) References Cited

U.S. PATENT DOCUMENTS 6,936,885 B2    8/2005  Shin et al.

| | | | |
|---|---|---|---|
| 2002/0001889 A1* | 1/2002 | Kim et al. ............ 438/183 |
| 2002/0020890 A1 | 2/2002 | Willer | |
| 2006/0003518 A1* | 1/2006 | Harter et al. ........... 438/222 |
| 2006/0033144 A1 | 2/2006 | Forbes et al. | |
| 2006/0152794 A1* | 7/2006 | Yang ..................... 359/291 |
| 2006/0197160 A1 | 9/2006 | Sugimae et al. | |
| 2007/0018207 A1* | 1/2007 | Prinz ..................... 257/288 |
| 2007/0273954 A1* | 11/2007 | Mangrum ............... 359/291 |
| 2008/0012138 A1* | 1/2008 | Wang et al. ............ 257/758 |

FOREIGN PATENT DOCUMENTS

JP    11186528 A    7/1999

* cited by examiner

*Primary Examiner*—N Drew Richards
*Assistant Examiner*—Jae Lee
(74) *Attorney, Agent, or Firm*—Slater & Matsil, L.L.P.

(57) ABSTRACT

Gate stacks of an array of memory cells and a plurality of select transistors are formed above a carrier, the gate stacks being separated by spacers. An opening is formed between the spacers in an area that is provided for a source line. A sacrificial layer is applied to fill the opening and is subsequently patterned. Interspaces are filled with a planarizing layer of dielectric material. The residues of the sacrificial layer are removed and an electrically conductive material is applied to form a source line.

15 Claims, 4 Drawing Sheets

METHOD OF FORMING A SEMICONDUCTOR MEMORY DEVICE AND SEMICONDUCTOR MEMORY DEVICE

TECHNICAL FIELD

This invention concerns flash memory devices, especially NAND memory devices, having an array of memory cell transistors and select transistors, which are addressed by bitlines and source lines.

BACKGROUND

U.S. Pat. No. 6,936,885 B2 describes an NAND-type flash memory device and methods of fabricating the same. A surface of a semiconductor substrate is patterned by parallel strips of insulating regions that delimit the active areas of the device. Wordlines are arranged transversally to the striplike active areas and cross the insulating regions. Rows of memory cell transistors that are connected in series are limited on both ends by select transistors, which are connected to a source line and to drain contact plugs, respectively. The drain contact plugs are applied to the drain regions and are connected to bitlines that are arranged in superior levels above the memory cell array. In one variant of the described method, a spacer is formed on sidewalls of a string selection line pattern, a plurality of wordline patterns, and a ground selection line pattern. An etch stop layer and a first interlayer insulating layer are sequentially formed on the entire surface of the resultant structure and are successively patterned to form a slit-type common source line contact hole. At the same time, a drain contact hole exposing a drain region of the respective string is formed. Barrier insulating layers and conformal barrier metal layers are formed on sidewalls of the common source line contact hole and the drain contact hole. The metal layer is also applied to the bottom. A metal layer filling the common source line contact hole and the drain contact hole is formed on the entire surface of the resultant structure, and the metal layer and the barrier metal layers are etched to form planar metal patterns filling the common source line contact hole and the drain contact hole. A second interlayer insulating layer is formed on the entire surface of the resultant structure and patterned to form a bitline contact hole exposing a respective drain contact plug and a source contact hole exposing a predetermined region of the common source line.

SUMMARY OF THE INVENTION

The invention discloses a method of production of a semiconductor memory device, in which gate stacks of an array of memory cells and a plurality of select transistors are formed above a carrier. Spacers are formed between the gate stacks, and an opening is formed between the spacers in an area that is provided for a source line. A sacrificial layer is applied, thereby filling the opening. The sacrificial layer is patterned to form at least one remaining portion filling the opening. A planarizing layer of dielectric material is applied. The rest of the sacrificial layer is removed, and electrically conductive material is applied to form a source line.

In further embodiments of this method, openings for bitline contacts are formed together with the opening provided for the source line. The openings for bitline contacts are filled with the sacrificial layer. After patterning the sacrificial layer, the remaining portions having interspaces fill the openings. The electrically conductive material is applied to form a source line and at least one bitline via.

In a further embodiment, the sacrificial layer is patterned to form remaining portions filling the opening and covering an array of memory cells. The electrically conductive material is applied to form a source line and a shield.

The semiconductor memory device has an array of memory cells and a plurality of select transistors above a carrier, at least one source line, and a shield of electrically conductive material arranged above the array of memory cells.

These and other features of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
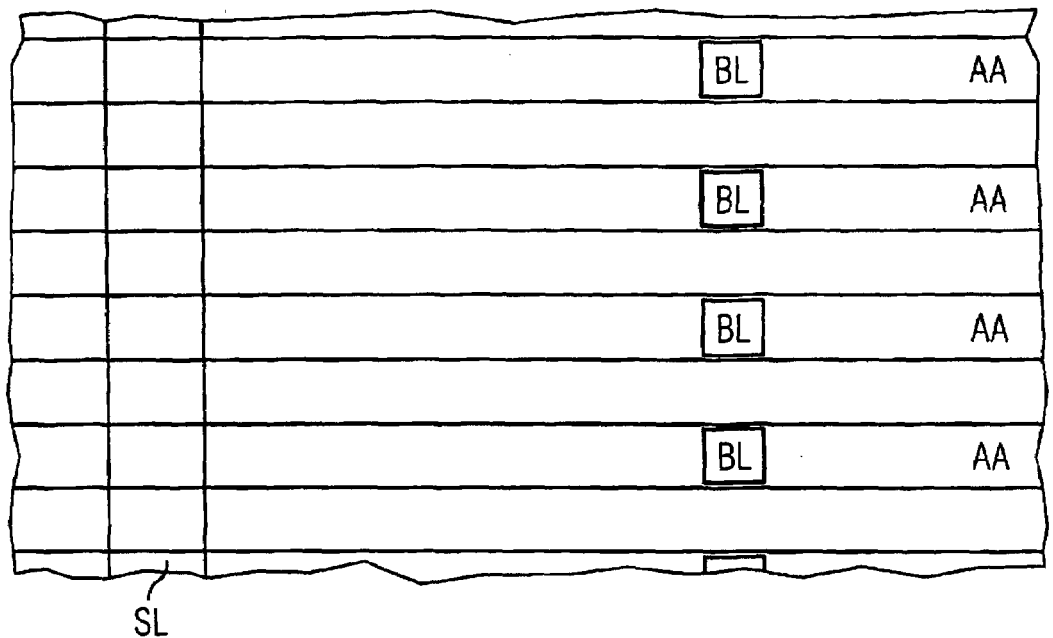
FIG. 1 shows a plan view of a carrier surface indicating the arrangement of the active areas, the bitline contacts, and the source line.

FIG. 1 shows a plan view onto the surface of a carrier, for example a semiconductor substrate. The active areas AA are interrupted by insulating regions, which can be formed by shallow trench isolations. The bitline contacts BL are provided in a schematically shown pattern within the active areas. Parallel to the arrangement of the bitline contacts, a source line SL is provided above the carrier surface. This is the basic pattern of a memory device in a NAND architecture.

Figure 2:
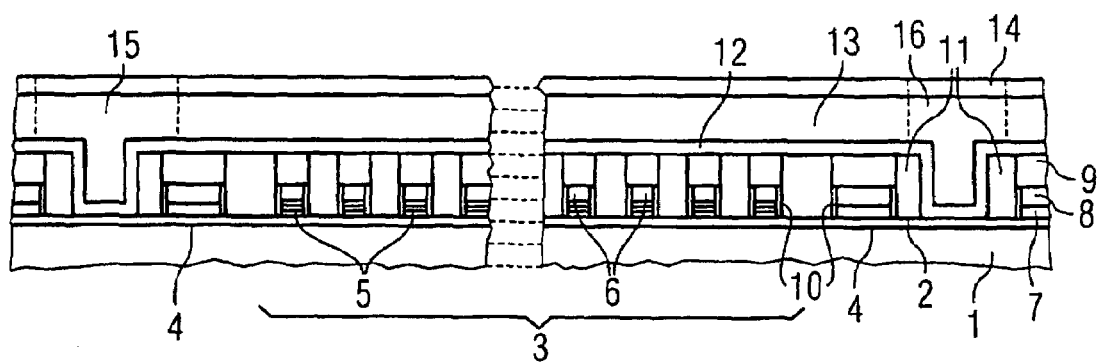
FIG. 2 shows a cross-section of an intermediate product of a first embodiment after the application of sacrificial layer.

FIG. 2 shows a cross-section of an intermediate product of a first variant of the method. The carrier 1 can be a semiconductor substrate or a semiconductor body that is provided with a layer or layer sequence of semiconductor material. The main surface can be provided with a thin oxide layer 2. A memory cell array 3 of memory cell transistors 5 is arranged above the carrier surface. Select transistors 4 are provided at the boundary of the array of memory cell transistors 5. Each transistor has a gate stack 6, which can typically encompass a polysilicon layer 7 provided as gate electrode and a metal layer 8 provided for a reduction of the track resistance. In a gate stack of a memory cell transistor 5, the gate electrode can be split into a control gate electrode, an intermediate dielectric layer, and a floating gate electrode that is provided as the storage means. The gate stack is electrically insulated by a top insulating layer 9, which can be silicon nitride, for instance, and a sidewall insulating layer 10, which can be formed by sidewall spacers of nitride, for instance. The metal layer 8 of the gate stacks 6 can be tungsten, for example. A layer of a spacer material, a nitride or an oxide for example, is deposited on the surface. This can be affected by LPCVD (low-pressure chemical vapor deposition) to deposit a nitride layer of a thickness of typically 35 nm. This layer is preferably deposited conformally to the surface and is subsequently anisotropically etched to form sidewall spacers 11 to the gate stacks. In the example of FIG. 2, the spacers 11 fill the interspaces between the memory cell transistors 5 completely. After a possible standard wet cleaning step and an optional implantation of source/drain regions in the addressing periphery and possibly also in the area of the memory cell array, an auxiliary layer 12 is deposited, for example by means of TEOS (tetraethylorthosilicate).

A sacrificial layer 13 is then applied all over the surface, so that the openings between the spacers 11 are filled. The sacrificial layer 13 can be polysilicon, especially undoped polysilicon. A subsequent CMP step (chemical mechanical polishing) renders a planar surface. A layer provided for a hardmask 14 is then applied, which may especially be a nitride that is deposited by chemical vapor deposition (CVD). The hardmask 14 is structured so that its remaining portions cover the regions of the sacrificial layer 13 that are indicated by vertical broken lines in FIG. 2. These regions are provided for a dummy 15 of a source line and a dummy 16 of a bitline via. Although the cross-section of FIG. 2 shows only one location of a source line and a bitline via, pluralities of source lines and bitline vias can be provided.

Figure 3:
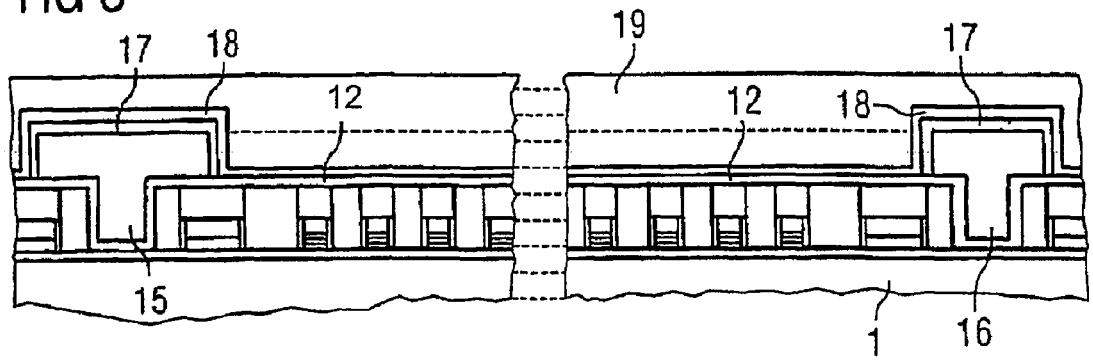
FIG. 3 shows a cross-section according to FIG. 2 of a further intermediate product after the application of a planarizing layer.

FIG. 3 shows a cross-section according to FIG. 2 after the patterning of the sacrificial layer 13 into the dummy 15 of the source line and the dummy 16 of the bitline via. If the hardmask 14 is a nitride and the sacrificial layer 13 is polysilicon, the sacrificial layer 13 can be etched with a standard etchant that is conventionally used to etch polysilicon. The residues of the hardmask are then removed. Tetraethylorthosilicate can then again be applied to form a further auxiliary layer 17. A cover layer 18 is applied, which can be nitride, for example, and which can again be deposited by LPCVD. The surface is then planarized with a planarizing layer 19, which can be boronphosphorussilicate glass, for example. However, other dielectric materials may be suitable as well. The planarization step can be effected by CMP, stopping at the further auxiliary layer 17, so that the upper surfaces of the remaining portions of the sacrificial layer are laid bare. The corresponding level is indicated with the horizontal broken line in FIG. 3.

Figure 4:
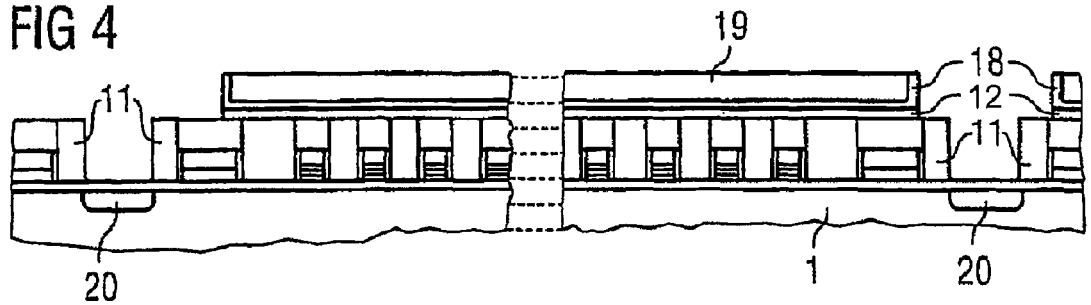
FIG. 4 shows a cross-section according to FIG. 3 after the removal of the sacrificial layer.

FIG. 4 shows the cross-section of the structure that is obtained after the removal of the dummies 15, 16, which are now substituted with corresponding openings. An implantation step can now be performed to produce doped regions 20, which are provided as source/drain regions. This can be a standard implantation of arsenic. As can be seen from FIG. 4, both the first auxiliary layer 12 and the further auxiliary layer 17 are preferably removed from the sidewalls and bottoms of the openings, before the implantation takes place. The thin oxide layer 2 can also be removed, or it can be maintained to provide a scattering during the implantation. It has been mentioned above that this implantation can already be performed before the deposition of the sacrificial layer 13 according to FIG. 2.

Figure 5:
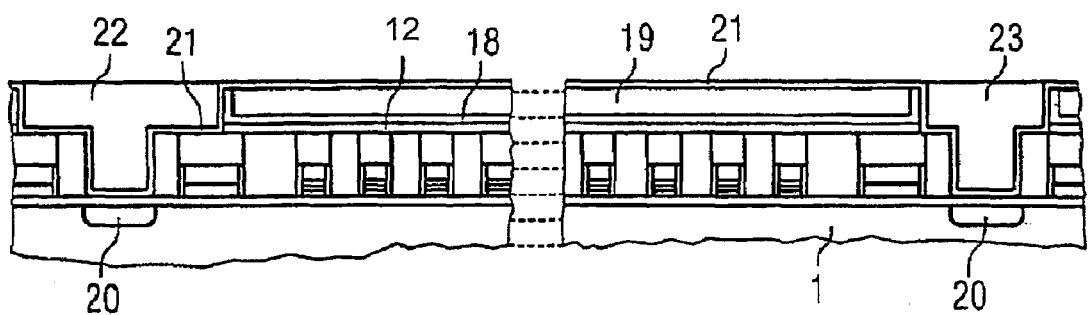
FIG. 5 shows a cross-section according to FIG. 4 after the application of the source line and a bitline via.

FIG. 5 shows a further intermediate product in a cross-section according to FIG. 4. After the implantation, a thin liner 21 is preferably sputtered onto the surface. Then the electrically conductive material that is provided for source line 22 and bitline via 23 is applied into the openings. The electrically conductive material can be tungsten, for instance, which can be applied by MCVD (metal chemical vapor deposition). The applied material is then planarized to form the planar surfaces shown in FIG. 5. If a metal like tungsten is applied, the planarization can be effected by CMP, stopping on the liner 21, or by etching the metal back in situ. It is now possible to connect the bitline via 23 separately from the source line 22.

Figure 6:
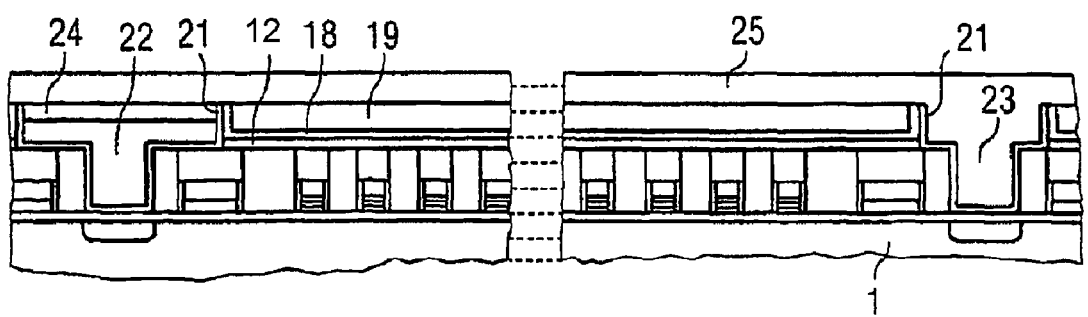
FIG. 6 shows a cross-section according to FIG. 5 after the application of a metal layer contact-connecting the bitline via.

FIG. 6 shows a cross-section according to FIG. 5 after the formation of a recess in the source line 22. A dielectric layer 24, for example an oxide, is filled into the recess. A further CMP step can be performed, stopping on the liner 21, so that a planar surface is obtained again. Then the liner is preferably removed from the upper surface by an etching step. Before a metal layer 25 is applied, preferably a thin barrier layer, not shown in the figure, is sputtered onto the surface. The metal layer 25 is then applied, for instance from tungsten, and structured into the shape that is provided for the bitlines. This can be done in a way known per se by a lithography step with subsequent etching.

Figure 7:
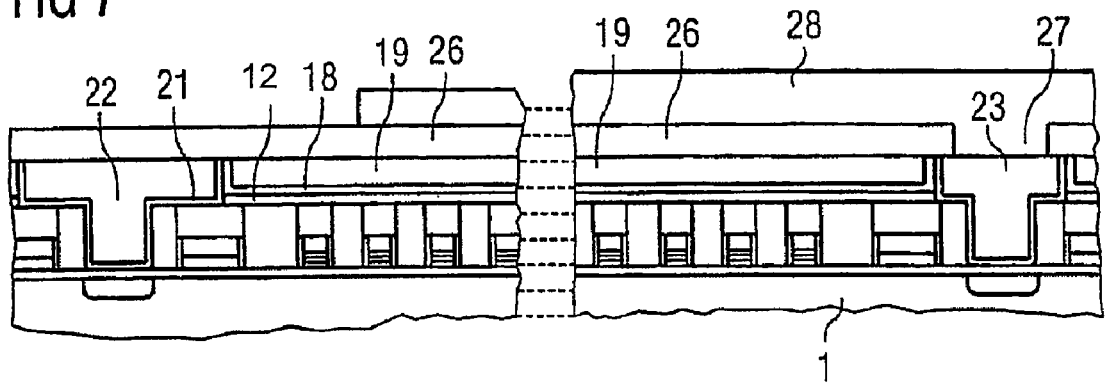
FIG. 7 shows a cross-section according to FIG. 5 after the application of a dielectric layer, a via, and a metal layer contact-connecting the bitline via.

FIG. 7 shows an alternative embodiment in a cross-section according to FIG. 6. Instead of the recess in the source line, in this embodiment a dielectric layer 26 is applied onto the surface. A via 27 of electrically conductive material is formed in the dielectric layer 26 above the bitline via 23, thus contact-connecting the bitline via 23. A metal layer 28, for example formed from tungsten, is then applied above the dielectric layer 26, so that the via 27 is electrically connected by the metal layer 28. The dielectric layer 26 electrically insulates the metal layer 28 from the source line 22. The other structural components of this embodiment are similar to the embodiment according to FIG. 6.

Figure 8:
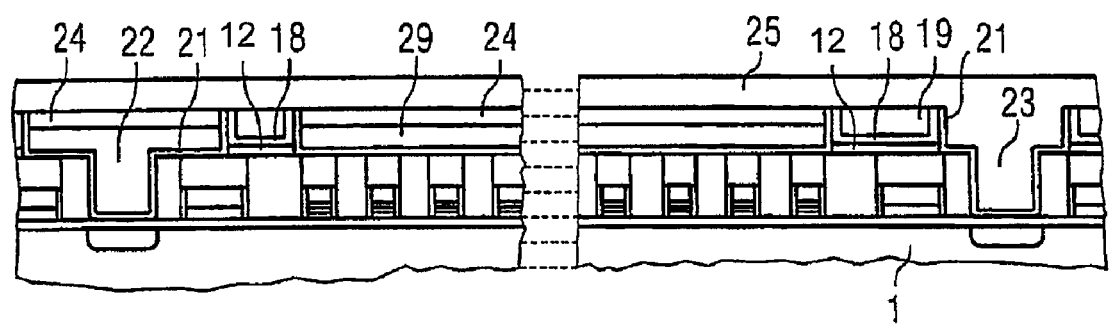
FIG. 8 shows a cross-section according to FIG. 6 of an embodiment encompassing a shield above the memory cell array.

FIG. 8 shows a further embodiment in a cross-section according to the cross-section of FIG. 6. The structures of the embodiments according to FIGS. 6 and 8 are similar, but the further embodiment according to FIG. 8 is additionally provided with a shield 29 that is formed from electrically conductive material. The shield is produced by means of a further dummy portion of the sacrificial layer 13 shown in FIG. 2. Additionally to the dummies of the source line and the bitline via, a section of the sacrificial layer 13 is maintained in an area covering the memory cell array 3. The further manufacturing steps are similar to the steps that have already been described. When the planarizing layer 19 has been applied and the sacrificial layer is removed, an area that is provided for the shield above the memory cell array 3 is left free from the planarizing layer 19. The electrically conductive material that is provided for the source line and the bitline via is preferably applied in the same production step to form the shield 29 also. The embodiment shown in FIG. 8 is similar to the embodiment according to FIG. 6, in which the source line 22 is recessed, so that the dielectric layer 24 insulating the source line 22 from the metal layer 25 can be applied. A corresponding recess is formed in the material of the shield, as shown in FIG. 8, so that the dielectric layer 24 also insulates the shield 29 from the metal layer 25.

Figure 9:
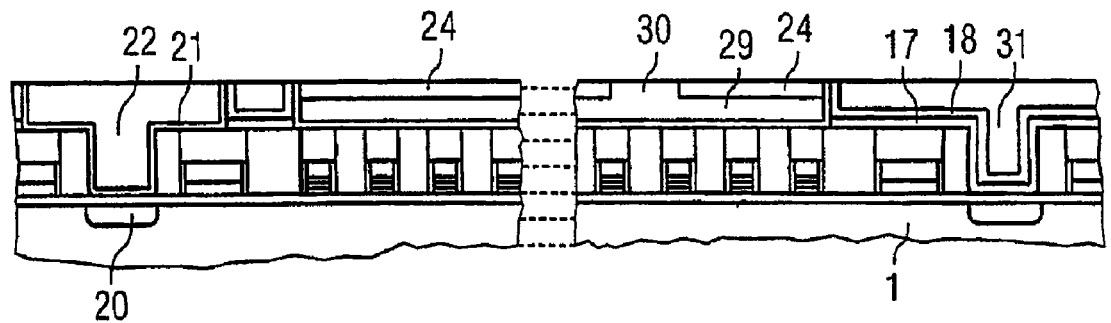
FIG. 9 shows a cross-section according to FIG. 8 for another embodiment having a dielectric filling in the area of the bitline via.

FIG. 9 shows a further embodiment, in which a contact is provided to the shield 29, but the opening of the bitline via is filled with a dielectric filling 31. The opening can be completely clad with the further auxiliary layer 17 and the cover layer 18 connection to the shield 29 is formed by a plug 30 of electrically conductive material.

Figure 10:
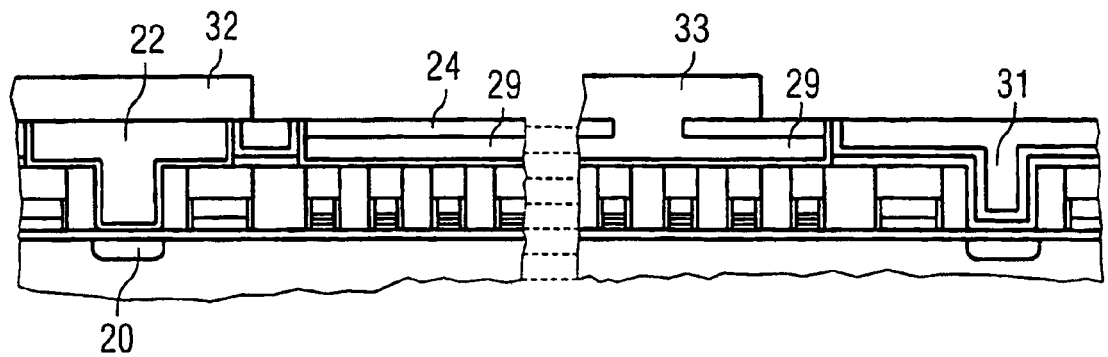
FIG. 10 shows a cross-section according to FIG. 9 after the application of connections to the source and shield.

FIG. 10 shows the electric connection of the source line 22 by a connection 32 to the source and of the shield by a connection 33 to the shield via the plug.

Figure 11:
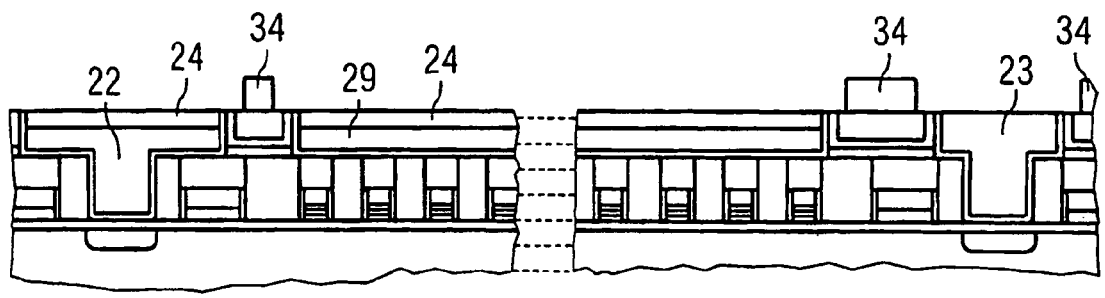
FIG. 11 shows a cross-section according to FIG. 8 after the application of a hardmask.

FIG. 11 shows a further embodiment similar to the embodiment according to FIG. 8, in which use is made of a hardmask 34, which can be nitride, for example. The hardmask 34 is preferably formed after the application of the electrically conductive material forming the source line 22, the bitline via 23 and the shield 29, and it is patterned, preferably by a standard lithography step, to have openings in the areas of the source line 22, the bitline via 23, and the shield 29. After the patterning of the hardmask 34, the source line 22 and the shield 29 are recessed and the dielectric layer 24 is applied in the manner shown in FIG. 11. The dielectric layer 24 can be an oxide that is deposited through the openings of the hardmask 34 into the recessed regions above the electrically conductive material. A planarizing step, preferably by CMP, stops on the hardmask 34, and the dielectric layer 24 can subsequently be recessed down to the level shown in FIG. 11. Then the metal layer 25 is applied.

Figure 12:
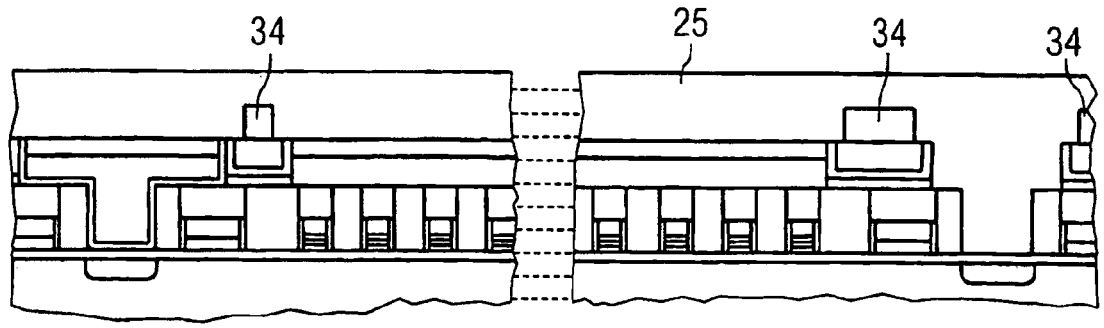
FIG. 12 shows a cross-section according to FIG. 11 after the application of the metal layer.

FIG. 12 shows the cross-section according to FIG. 11 after the application of the metal layer 25. The metal layer 25 can be tungsten that is applied onto a previously sputtered barrier layer. The barrier layer is extremely thin and not shown in FIG. 12. The metal layer 25 is then structured into the strips of bitlines.

Although the present invention and its advantages have been described in detail, it should be understood that various changes, substitutions and alterations can be made herein without departing from the spirit and scope of the invention as defined by the appended claims.

What is claimed is:

1. A method of forming a semiconductor memory device, the method comprising:
    forming gate stacks of an array of memory cells and a plurality of select transistors above a carrier;
    forming spacers between the gate stacks;
    forming an opening between the spacers in an area that is provided for a source line;
    applying a sacrificial layer and filling the opening with the sacrificial layer;
    patterning the sacrificial layer to form a patterned sacrificial layer having interspaces, the patterned sacrificial layer having a first portion filling the opening, and a second portion substantially parallel to the carrier and disposed above a top surface of the array of memory cells;
    filling the interspaces with a planarizing layer of dielectric material;
    removing the patterned sacrificial layer;
    applying an electrically conductive material to form the source line and a shield; and A1
    applying tetraethylorthosilicate to form a further auxiliary layer after the patterning the sacrificial layer.

2. The method according to claim 1, wherein the sacrificial layer is formed from polysilicon.

3. The method according to claim 1, further comprising:
    forming further openings between the spacers;
    patterning the sacrificial layer to form remaining portions having interspaces that leave the further openings free of the sacrificial layer; and
    filling the interspaces with the planarizing layer of dielectric material.

4. The method according to claim 1, further comprising:
    forming openings between the spacers in areas that are provided for the source line and for bitline contacts;
    patterning the sacrificial layer to form remaining portions filling the openings; and
    applying the electrically conductive material to form the source line, the shield, and a bitline via.

5. The method according to claim 4, further comprising:
    forming recesses in the source line and in the shield;
    applying a dielectric material into the recesses; and
    applying a metal layer contact-connecting the bitline via.

6. The method according to claim 4, further comprising:
    applying a dielectric layer onto the source line, the shield, and the bitline via;
    forming a further via on the bitline via; and
    applying a metal layer contact-connecting the further via.

7. The method according to claim 1, further comprising:
    forming recesses in the source line and in the shield;
    applying a dielectric material into the recesses;
    forming a plug of the electrically conductive material in the dielectric material on the shield, the plug contact-connecting the shield; and
    applying a metal layer contact-connecting the plug.

8. The method according to claim 1, further comprising applying tetraethylorthosilicate to form an auxiliary layer before the applying the sacrificial layer.

9. The method according to claim 1, further comprising forming the planarizing layer from boronphosphorussilicate glass.

10. A method of forming a semiconductor memory device, the method comprising:
    forming gate stacks of an array of memory cells and a plurality of select transistors above a carrier;
    forming spacers between the gate stacks;
    forming an opening between the spacers in an area that is provided for a source line;
    applying a sacrificial layer and filling the opening with the sacrificial layer;
    patterning the sacrificial layer to form a patterned sacrificial layer having interspaces, the patterned sacrificial layer having a first portion filling the opening, and a second portion substantially parallel to the carrier and disposed above a top surface of the array of memory cells;
    filling the interspaces with a planarizing layer of dielectric material;
    removing the patterned sacrificial layer;
    applying an electrically conductive material to form the source line and a shield;
    applying a hardmask on the planarizing layer after applying the electrically conductive material to form the source line, the hardmask having a smooth upper surface level;
    forming a recess in the electrically conductive material;
    filling the recess with a dielectric layer;
    planarizing the dielectric layer to the upper surface level of the hardmask; and
    applying a metal layer.

11. The method according to claim 1, wherein the sacrificial layer forms a planarized surface above the opening and the gate stacks.

12. The method according to claim 11, further comprising planarizing the sacrificial layer before patterning the sacrificial layer.

13. A method of forming a semiconductor memory device, the method comprising:

forming gate stacks of an array of memory cells and a plurality of select transistors above a carrier;

forming spacers between the gate stacks;

forming a first opening between the spacers in an area that is provided for a source line;

applying an auxillary layer onto the first opening, the auxillary layer forming a liner around a bottom surface and sidewalls of the first opening;

applying a sacrificial layer onto the auxiliary layer and filling the first opening with the sacrificial layer, wherein a top surface of the sacrificial layer is disposed above a top surface of the gate stacks;

forming a hardmask layer on the top surface of the sacrificial layer;

patterning the sacrificial layer using the hardmask layer;

forming a further auxillary layer over the patterned sacrificial;

forming a cover layer over the further auxillary layer to form interspaces adjacent the patterned sacrificial layer;

removing the cover layer and the further auxillary layer disposed over the patterned sacrificial layer;

removing the patterned sacrificial layer and the exposed auxillary layer; and applying an electrically conductive material to form the source line and a shield.

14. The method according to claim 13, further comprising:

forming a second opening between the spacers in areas that are provided for bitline contacts, wherein applying an auxiliary layer comprises applying the auxiliary layer onto the second opening, the auxiliary layer forming a liner around a bottom surface and sidewalls of the second opening; and filling the second opening with the sacrificial layer, wherein applying an electrically conductive material comprises forming a bitline via.

15. The method according to claim 14, further comprising:

forming recesses in the source line and in the shield;

applying a dielectric material into the recesses; and applying a metal layer contact-connecting the bitline via.

* * * * *